United States Patent [19]

Tagami

[11] Patent Number: 4,847,810

[45] Date of Patent: Jul. 11, 1989

[54] MEMORY HAVING REDUNDANCY CIRCUIT

[75] Inventor: Tomoyuki Tagami, Nara, Japan

[73] Assignee: Sharp Kabushiki Kaisha, Osaka, Japan

[21] Appl. No.: 039,669

[22] Filed: Apr. 16, 1987

[30] Foreign Application Priority Data

Apr. 22, 1986 [JP] Japan .................................. 61-95448

[51] Int. Cl.$^4$ ..................... G11C 7/00; H03K 19/094; H03K 19/082
[52] U.S. Cl. ................................ 365/200; 307/202.1; 307/219; 307/303; 307/449; 307/463; 307/200.1; 371/10
[58] Field of Search ........... 307/219, 463, 449, 200 B, 307/303, 202.1; 365/200; 371/10

[56] References Cited

U.S. PATENT DOCUMENTS 4,613,959 9/1986 Jiang ..................................... 307/219
4,701,636 10/1987 Millhollan et al. ............... 307/202.1

OTHER PUBLICATIONS

IBM Tech. Disc. Bul. "Redundant Bit Line Decode Circuit", vol. 18, No. 6, 11/75.

Primary Examiner—Stanley D. Miller
Assistant Examiner—M. R. Wambach
Attorney, Agent, or Firm—Flehr, Hohbach, Test, Albritton & Herbert

[57] ABSTRACT

In a semiconductor IC device such as a memory device with circuits to be selected and circuits to select one of these circuits to be selected in response to an input signal, each circuit to be selected is divided into parts but a fuse is provided corresponding to each of the parts such that each of the defective parts can be replaced by redundancy circuit without invalidating the other parts of the same circuit that is replaced.

7 Claims, 2 Drawing Sheets

FIG. — 1

MEMORY HAVING REDUNDANCY CIRCUIT

BACKGROUND OF THE INVENTION

This invention relates to a semiconductor IC device with redundancy circuits and more particularly to such a circuit with which a redundancy circuit can be replaced in an improved manner.

The yield of semiconductor IC circuits, and more particularly semiconductor memory devices, usually drops as they are miniaturized in order to increase their capacity. Their yield also drops as the manufacturing process becomes complicated or the chip size is increased. One of the methods of preventing such a drop in the yield has been to provide inside each memory chip not only the usual set of components such as bit lines, bit line selection lines, word lines, memory cells, row decoders, bit line selection circuits and column decoders, but also what is frequently refererd to as redundancy circuits comprising reserve bit lines, etc. such that, when a defect is found in the original set of components, such a defective component can be replaced by the reserve component. A certain percentage of what would otherwise be deemed a defective chip can be rescued by using a redundancy circuit in this manner. When a defect is discovered and it is decided to make use of a redundancy circuit, a polysilicon fuse or the like is usually cut by melting to inactivate the row decoder or column decoder containing the address of the defective bit. At the same time, the address of the defect must be programmed into the reserve row decoder or column decoder.

With reference to FIG. 2 which shows a dynamic RAM as an example of semiconductor memory device having a redundancy circuit, AB indicates an address bus, CDEC0 through CDEC2 are original (not redundant) column decoders, CDECR is a reserve (redundant) column decoder, SL0 through SL2 and SR0 through SR2 are original bit line selection circuits, SLR and SRR are reserve bit line selection circuits, BSL0 through BSL2 and BSR0 through BSR2 are original bit line selection lines, BSLR and BSRR are reserve bit line selection lines, BL0 through BL2 and BR0 through BR2 are original bit lines, BLR and BRR are reserve bit lines, RDEC0 through RDEC3 are row decoders and WL0 through WL3 are word lines. In FIG. 3 which shows the circuit inside any one of the column decoders CDEC0 through CDEC2, Fi indicates a fuse.

Let us consider a situation where the addresses A1 is defective in the memory device of FIG. 2 with column decoders structured as shown in FIG. 3. In order to rescue the device, the fuse F0 inside the column decoder CDEC0 is cut first to inactivate the bit line selection line BSL0, the bit line selection circuit SL0 and the bit line BL0 connected to the column decoder CDEC0, and the address A1 is thereafter programmed into the redundant column decoder CDECR. In this manner, the defective bit address A1 is effectively replaced by the address A1' on the reserve bit line BLR.

In this situation, however, the bit with address A2 which is not assumed to be defective also becomes unusable simply because it is selected by the same column decoder CDEC0. Thus, it becomes necessary to also replace the address A2 by A2'. In other words, an extra redundancy circuit is used up wastefully because of the aforementioned unnecessary address replacement. If the address A3 were also defective in addition to the address A1, therefore, two sets of redundancy circuits such as reserve column decoders CDECR, etc. become necessary. An increased number of redundancy circuits means an increase in the chip area.

SUMMARY OF THE INVENTION

It is therefore an object of the present invention to provide a semiconductor IC device with improved redundancy characteristics wtihout increased chip area or a chip with smaller area having the same redundancy characteristics.

The above and other objects of the present invention are achieved by providing a semiconductor IC device with a redundancy circuit and a fuse corresponding to each of the parts to which circuits to be selected are divided. If a fuse corresponding to a defective part is cut, this does not affect the other parts of the same circuit and hence only the actually defective part is replaced by the redundancy circuit.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF THE INVENTION

Figure 1:
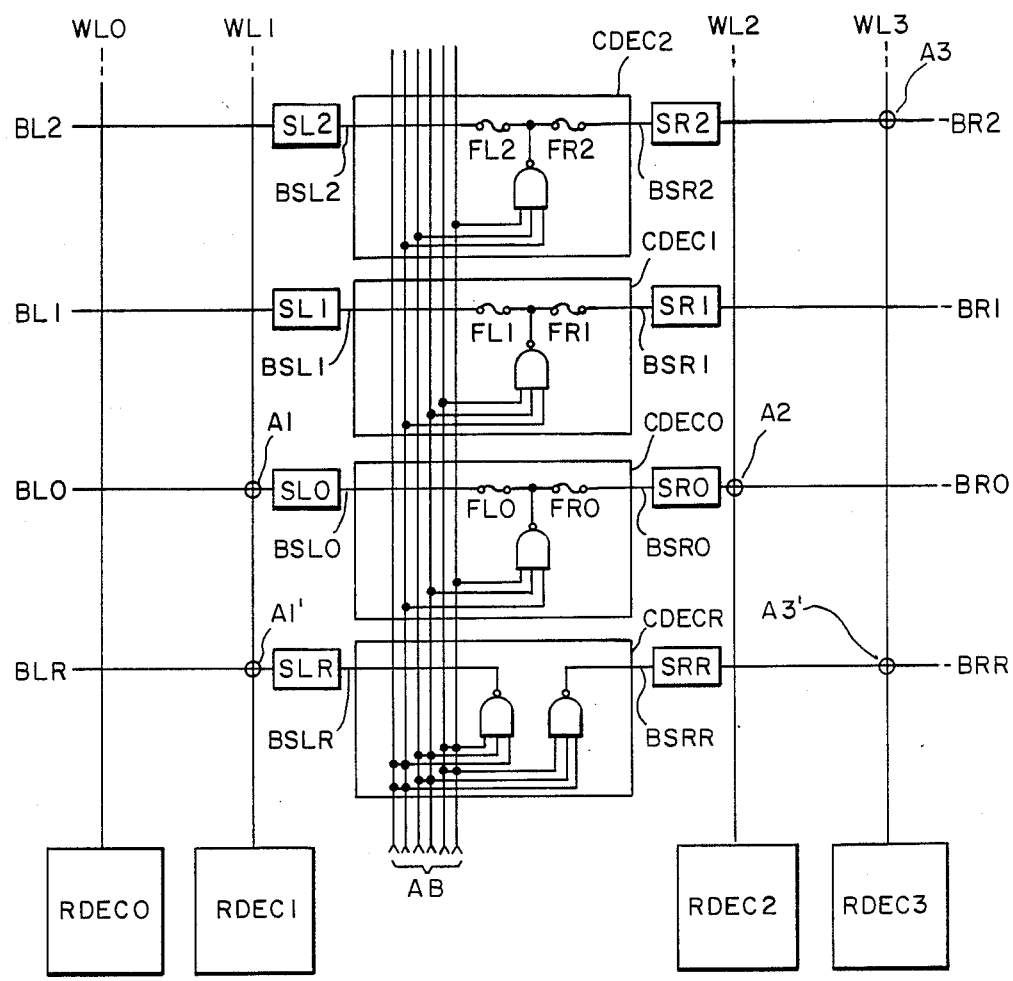
FIG. 1 is a circuit diagram of a dynamic RAM embodying the present invention.
Figure 2:
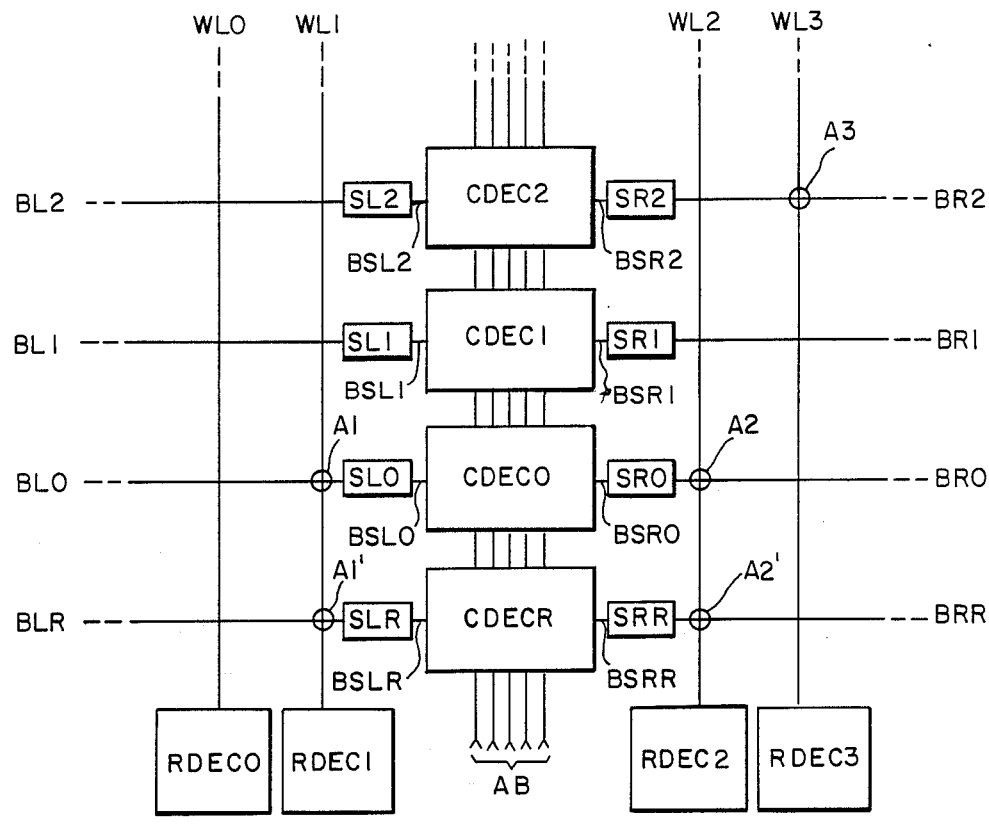
FIG. 2 is a circuit diagram of a previously considered dynamic RAM with a redundancy circuit.
Figure 3:
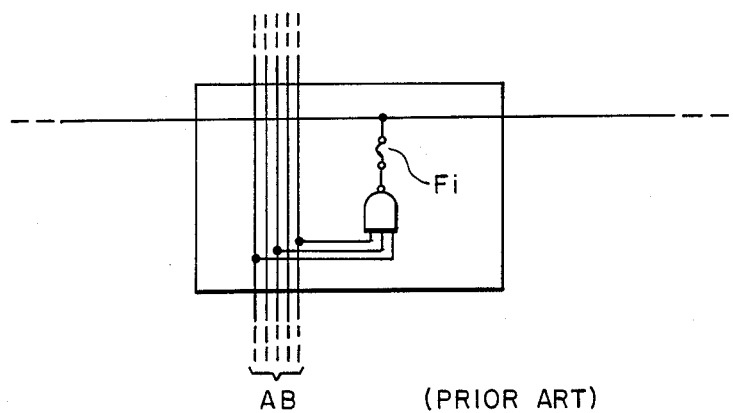
FIG. 3 is a circuit diagram of each of the column decoders of FIG. 2.

The structure of a dynamic RAM embodying the present invention is depicted in FIG. 1 wherein components which are identical or similar to those in FIG. 2 and explained in connection therewith are indicated by the same symbols. The circuit of FIG. 1 is characterized by the structure of the original and redundancy column decoders CDEC0 through CDEC2 and CDECR. Inside each original column decoder CDECi (where i=0, 1 or 2) are a pair of fuses FLi and FRi so that the bit lines, etc. on the left-hand side and the right-hand side can be independently inactivated. The redundancy column decoder is so structured that different addresses can be programmed to the redundancy bit lines, etc. on the left-hand side and the right-hand side. A rescue method when addresses A1 and A3 represent defective bits is explained below by way of FIG. 1.

The fuse FL0 inside the column decoder CDEC0 is cut by a laser beam or the like to inactivate the selection line BSL0, the bit line selection circuit SL0 and the bit line BL0. Next, of the two programmable NAND gates in the redundancy column decoder CDECR, the one connected to the bit line selection line BSLR is programmed to the same address as the NAND gate inside CDEC0. The fuse FR2 inside the column decoder CDEC2 is similarly cut and the NAND gate inside CDECR connected to the bit line selection line BSRR is programmed to the same address as the NAND gate inside CDEC2. In this manner, defective bit addresses A1 and A3 are effectively replaced by addresses A1' and A3'. By the operation described above, the address A2 is not inactivated. Thus, there is no need for a wasteful address replacement. In summary, one set of redundancy circuit such as redundancy column decoder and redundancy bit line can accomplish according to the present invention what previously required two sets.

The foregoing description of a preferred embodiment of the invention has been presented for purposes of illustration and description. It is not intended to be exhaustive or to limit the invention to the precise form disclosed, and many modifications and variations are possible in light of the above teaching. For example, the present invention is applicable not only to dynamic RAMs but also to any semiconductor IC device having a plurality of circuits to be selected which are divided into parts and selection circuits for selecting one of these parts in response to an input signal. Such modifications and variations that may be apparent to a person skilled in the art are intended to be included within the scope of this invention.

What is claimed is:

1. In a semiconductor memory device comprising a plurality of combinations each having a selecting circuit which outputs a selection signal in response to a predetermined input signal therefor and two selectable circuits which are activated by said selection signal, the improvement wherein said memory device further comprises one or more redundancy combinations each having a spare selecting circuit and two spare selectable circuits, wherein said two selectable circuits are separately connected to said selecting circuit in each of said combinations, and wherein each of said combinations further includes two normally closed circuit-opening elements through which said selection signal is transmitted from said selecting circuit individually to said selectable circuits, whereby each of said two selectable circuits of each of said combinations can be selectively inactivated by selectably opening one of said circuit-opening elements.

2. The device of claim 1 wherein said selecting circuits are column decoders.

3. The device of claim 1 wherien said selectable circuits comprise bit lines.

4. The semiconductor memory device of claim 1 wherein said two spare selectable circuits are separately connected to said spare-selecting circuit within each of said redundancy combinations, wherein said spare selecting circuit includes two address-selecting circuits which are so connected that, if a selected one of said circuit-opening elements is opened, a condition for output of an address-selecting signal corresponding to said selected one of said circuit-opening elements from one of said address-selecting circuits is determined, and wherein each of said address-selecting circuits has an output terminal which is connected to one of said spare selectable circuits.

5. The semiconductor memory device of claim 4 wherein said address-selecting circuits comprise NAND gates.

6. The semiconductor memory device of claim 1 wherein said normally closed circuit-opening elements are fuses which can be opened by a laser beam.

7. The semiconductor memory device of claim 1 further comprising two groups of bit lines, each of said groups of bit lines being connected individually to one of said two selectable circuits and one of said two spare selectable circuits.

* * * * *